(12) United States Patent
Samuelson et al.

(10) Patent No.: US 9,012,887 B2
(45) Date of Patent: Apr. 21, 2015

(54) NANOWIRE GROWTH ON DISSIMILAR MATERIAL

(75) Inventors: Lars Samuelson, Malmö (SE); Jonas Ohlsson, Malmö (SE); Thomas Mårtensson, Lund (SE); Patrik Svensson, Palo Alto, CA (US)

(73) Assignee: Qunano AB, Lund (SE)

( * ) Notice: Subject to any disclaimer, the term of this patent is extended or adjusted under 35 U.S.C. 154(b) by 0 days.

(21) Appl. No.: 13/279,786

(22) Filed: Oct. 24, 2011

(65) Prior Publication Data
US 2012/0145990 A1 Jun. 14, 2012

Related U.S. Application Data

(63) Continuation of application No. 12/734,252, filed as application No. PCT/SE2008/051213 on Oct. 27, 2008, now Pat. No. 8,084,337.

(30) Foreign Application Priority Data

Oct. 26, 2007 (SE) ...................................... 0702402
Oct. 26, 2007 (SE) ...................................... 0702404

(51) Int. Cl.
*H01L 29/06* (2006.01)
*H01L 31/00* (2006.01)
(Continued)

(52) U.S. Cl.
CPC ........ *H01L 29/0665* (2013.01); *B81C 1/00111* (2013.01); *B82Y 10/00* (2013.01); *H01L 21/02381* (2013.01); *H01L 21/02433* (2013.01); *H01L 21/02538* (2013.01); *H01L 21/02609* (2013.01); *H01L 21/02645* (2013.01);
(Continued)

(58) Field of Classification Search
USPC .......... 257/200, 615, 627, E21.112, E21.121, 257/E29.07, 13, 14, 17; 438/946, 4, 478, 438/483, 584, 974; 977/762, 815, 890, 891, 977/949
See application file for complete search history.

(56) References Cited

U.S. PATENT DOCUMENTS 5,314,569 A 5/1994 Pribat et al.
6,882,051 B2 4/2005 Majumdar et al.
(Continued)

FOREIGN PATENT DOCUMENTS

EP 1727216A2 A2 11/2006
WO 2007102781 A1 9/2007

OTHER PUBLICATIONS

Extended European Search Report issued in European Patent Application No. 08843214.1, mailed on Sep. 19, 2012.
(Continued)

*Primary Examiner* — Meiya Li
(74) *Attorney, Agent, or Firm* — The Marbury Law Group PLLC

(57) ABSTRACT

The present invention relates to growth of III-V semiconductor nanowires (2) on a Si substrate (3). Controlled vertical nanowire growth is achieved by a step, to be taken prior to the growing of the nanowire, of providing group III or group V atoms to a (111) surface of the Si substrate to provide a group III or group V 5 surface termination (4). A nanostructured device including a plurality of aligned III-V semiconductor nanowires (2) grown on, and protruding from, a (111) surface of a Si substrate (3) in an ordered pattern in compliance with a predetermined device layout is also presented.

20 Claims, 8 Drawing Sheets

(51) Int. Cl.
 *B81C 1/00* (2006.01)
 *B82Y 10/00* (2011.01)
 *H01L 21/02* (2006.01)
 *H01L 33/18* (2010.01)

(52) U.S. Cl.
 CPC ...... *H01L21/02653* (2013.01); *H01L 29/0673* (2013.01); *H01L 29/0676* (2013.01); *H01L 29/068* (2013.01); *H01L 33/18* (2013.01); *Y10S 977/89* (2013.01); *Y10S 977/762* (2013.01); *Y10S 977/949* (2013.01); *Y10S 438/974* (2013.01); *Y10S 977/721* (2013.01); *Y10S 977/815* (2013.01); *Y10S 438/946* (2013.01)

(56) References Cited

U.S. PATENT DOCUMENTS

| | | | |
|---|---|---|---|
| 7,223,444 | B2 | 5/2007 | Deppert et al. |
| 7,528,002 | B2 | 5/2009 | Samuelson et al. |
| 7,960,260 | B2 | 6/2011 | Samuelson et al. |
| 2006/0091408 | A1 | 5/2006 | Kim et al. |
| 2006/0125056 | A1 | 6/2006 | Samuelson et al. |
| 2007/0228583 | A1 | 10/2007 | Islam et al. |
| 2008/0036038 | A1* | 2/2008 | Hersee et al. ............. 257/615 |
| 2010/0025673 | A1 | 2/2010 | Hu et al. |

OTHER PUBLICATIONS

International Preliminary Report on Patentability, PCT/SE2008/051213, Apr. 27, 2010.

Wu et al., "Size and Shape-Controlled GaN Nanocrystals Grown on Si(111) Substrate by Reactive Epitaxy," Applied Physics Letters, vol. 85, No. 11, Sep. 13, 2004.

Roest et al., "Position-Controlled Epitaxial III-V Nanowires on Silicon," Institute of Physics Publishing, Nanotechnology 17, 2006, pp. S271-S275.

Hu et al., "Nanocolumn InGa/GaN Quantum-well Crystals on Flat and Pillared Si Substrates with Nitrified Ga as a Buffer Layer," Institute of Physics Publishing, Nanotechnology 18, 2007, pp. 1-6.

Tateno et al., "Vertical GaP Nanowires Arranged at Atomic Steps on Si(111) Substrates," Applied Physics Letters, vol. 89, Section 033114, 2006, pp. 1-3.

Tchernycheva et al., "Growth of GaN Free-Standing Nanowires by Plasma-Assisted Molecular Beam Epitaxy: Structural and Optical Characterization," Institute of Physics Publishing, Nanotechnology 18, Section 385306, 2007, pp. 1-7.

Kamins et al., "Growth and Structure of Chemically Vapor Deposited Ge Nanowires on Si Substrates," Nano Letters, vol. 4, No. 3, 2004, pp. 503-506.

Ozaki et al., "Silicon Nanowhiskers Grown on a Hydrogen-Terminated Silicon (111) Surface," Applied Physics Letters, vol. 73, No. 25, Dec. 1998, pp. 3700-3702.

* cited by examiner

| | |
|---|---|
| A | AsH$_3$, switched on after 10s of NW growth |
| B | PH$_3$, 10s nucleation, protecting flow, 10s NW growth |
| C | TMGa, 5s preflow + 10s for nucleation at high-T, low T axial NW growth |

NANOWIRE GROWTH ON DISSIMILAR MATERIAL

TECHNICAL FIELD OF THE INVENTION

The present invention relates to growth of semiconductor nanowires on silicon. In particular the invention relates to growth of III-V semiconductors protruding perpendicular to the surface of a Si substrate.

BACKGROUND OF THE INVENTION

Over recent years the interest in semiconductor nanowires has intensified. Nanowires are also referred to as nanowhiskers, nanorods and nanocolumns etc. For the purpose of this application the term nanowire is to be interpreted as a structure being in essentially in one-dimensional form and that is of nanometer dimensions in its width or diameter. Such structures are commonly also referred to as nanowhiskers, one-dimensional nano-elements, nanorods, nanocolumns, nanotubes, etc. Although these terms imply an elongated shape the nanowires may have e.g. a pyramidal shape. Usually nanowires are considered to have at least two dimensions not greater than 100 nm. However, nanowires having a diameter or width of about 1 μm can be formed. Controlling the one-dimensional growth on the nanometer scale offers unique opportunities for combining materials, manipulating properties, both mechanical and electromagnetical, and to design novel devices. One of the useful devices that can be made due to the controlled one-dimensional growth of nanowires is light emitting diodes (LED).

Epitaxial growth of III-V semiconductors on Si presents several difficulties such as lattice mismatch, differences in crystal structure (III-Vs have a polar zincblende or wurtzite structure whereas Si has a covalent diamond structure), a large difference in thermal expansion coefficient and the formation of so called anti-phase domains. Much work has been done on planar growth of III-V materials on Si using different approaches attempting to grow device quality structures, see e.g. S. F. Fang et al., Gallium-Arsenide and Other Compound Semiconductors on Silicon, Journal of Applied Physics 68, R31-R58 (1990) for a review.

It is recognized that a III-V semiconductor nanowires grown out from an Si substrate would probably overcome several of the above mentioned problems, due to the small cross-section of the conjunction between the nanowires and the Si substrate. In many systems nanowires grow in a <111> direction and most commonly in the [111]B direction. The growth of non-vertical wires from Si(111) substrates is commonly observed, see e.g. A. L. Roest et al., Position-controlled epitaxial III-V nanowires on silicon, Nanotechnology 17, (11), S271-S275 (2006), and poses a problem in terms of process control. There are four <111> directions available from the non-polar Si(111) substrate where only one is vertical as illustrated in FIG. 1a. In industrial applications this may hinder an efficient processing and lower the yield of useful components.

SUMMARY OF THE INVENTION

The prior art methods of producing nanowires or nanostructures of III-V semiconductors on Si substrates needs improvements in order to be useable for large scale production of semiconductor devices.

The object of the present invention is to overcome the drawbacks of the prior art. This is achieved by the method and the device as defined in the independent claims.

A method of producing a nanostructured device in accordance with the invention comprises the steps of:
 providing group III or group V atoms to a (111) surface of a Si substrate in order to provide a group III or group V surface termination; and
 growing at least one III-V semiconductor nanowire from the (111) surface of the Si substrate.

In one embodiment of the method in accordance with the invention the method comprises the steps of:
 providing a group III or group V material, such as Ga or In, pre-flow at a predetermined elevated temperature to provide a group III or group V material-terminated Si(111) surface giving diffusion of the group III or group V material into a growth catalyst particle/Si interface, and formation of a group III or group V material layer in the growth catalyst particle/Si interface;
 a short growth step at a high temperature to form a thin nucleation layer; and
 lowering of the temperature to the temperature regime normally used for nanowire growth and performing axial nanowire growth.

In one embodiment of the method in accordance with the invention a plurality of nanowires are grown on the (111) surface in an ordered pattern in compliance with a predetermined device layout.

A nanostructured device according to the invention comprises a plurality of semiconductor nanowires, preferably made of III-V material, grown on a (111) surface of a Si substrate. Substantially all nanowires of the nanostructured device protrude perpendicular to the (111) surface. Preferably the nanowires are grown on the (111) surface of the Si substrate in an ordered pattern in compliance with a predetermined device layout. The ordered pattern may be a periodic pattern.

Thanks to the invention it is possible to provide III-V nanowires on Si substrates in only one predetermined direction. Such structures facilitate the growth of a single-domain coalescence layers with the nanowires as templates or the manufacturing of semiconductor devices for electronic, optoelectronic, photonic, light emitting diode applications, etc.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein.

DETAILED DESCRIPTION OF EMBODIMENTS

Figure 1A:
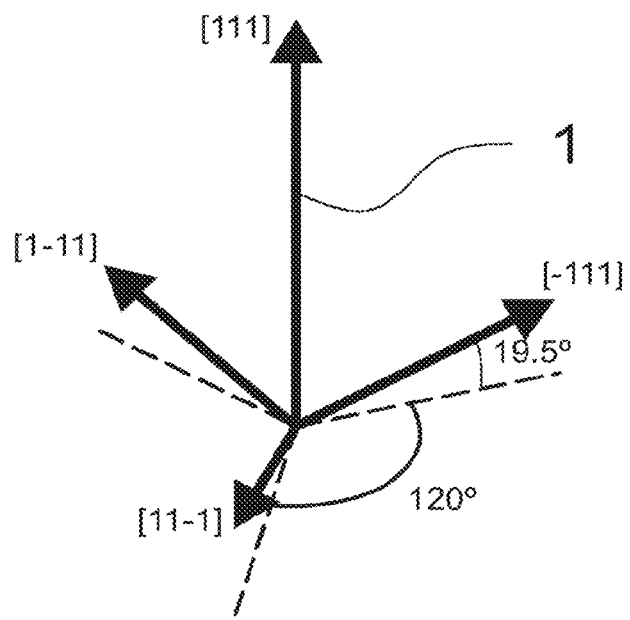
FIG. 1a schematically illustrates four available <111> directions from a FCC (111) surface, wherein, in the case of a polar III-V (111)B surface, the arrow 1 indicates a <111>B direction whereas the other arrows denote <111>A directions.
Figure 1B:
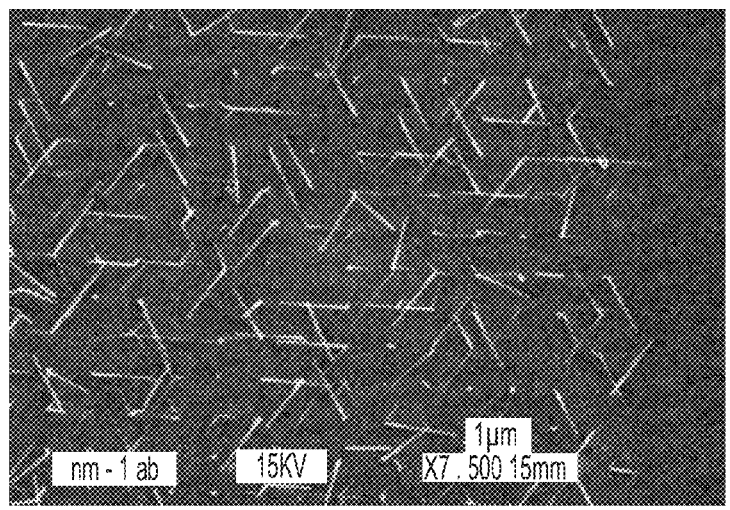
FIG. 1b is a top view of GaP nanowires grown on a (111) surface of a Si substrate according to a prior art method.

On many semiconductor substrates nanowires grow in a <111> direction and most commonly in the [11̄1]B direction. However, the growth of non-vertical wires from Si(111) substrates is commonly observed and poses a problem in terms of process control. As schematically illustrated in FIG. 1a, there are four <111> directions available from the non-polar Si(111) substrate where only one, in the figure denoted 1, is vertical, i.e. at 90° angle to the substrate. The term vertical is interpreted is for the purpose of this application interpreted as the nanowire is protruding from the substrate in a direction perpendicular to the substrate. The terms vertical and perpendicular, as well as the terms orthogonal and normal to, are used interchangeably throughout the application. A 100% yield of vertical nanowires protruding from the substrate is desired. Although highly aligned vertical III-V nanowires grown on Si have been demonstrated, see T. Mårtensson et al., Epitaxial III-V nanowires on silicon, Nano Letters 4, (10), 1987-1990, 2004, large area uniformity with respect to the growth direction and especially vertical growth from lithographically defined gold nanoparticles or growth catalyst particle need to be improved. A second challenge is to achieve well defined growth of nanowires on predetermined positions and in predetermined patterns on Si, and also to do this with nanowires aligned in the direction vertical to the (111) surface of a Si substrate. A typical example of GaP nanowires grown on Si(111) according to prior art methods is shown in FIG. 1b, where the nanowires protrude randomly in the four <111> directions.

Figure 2:
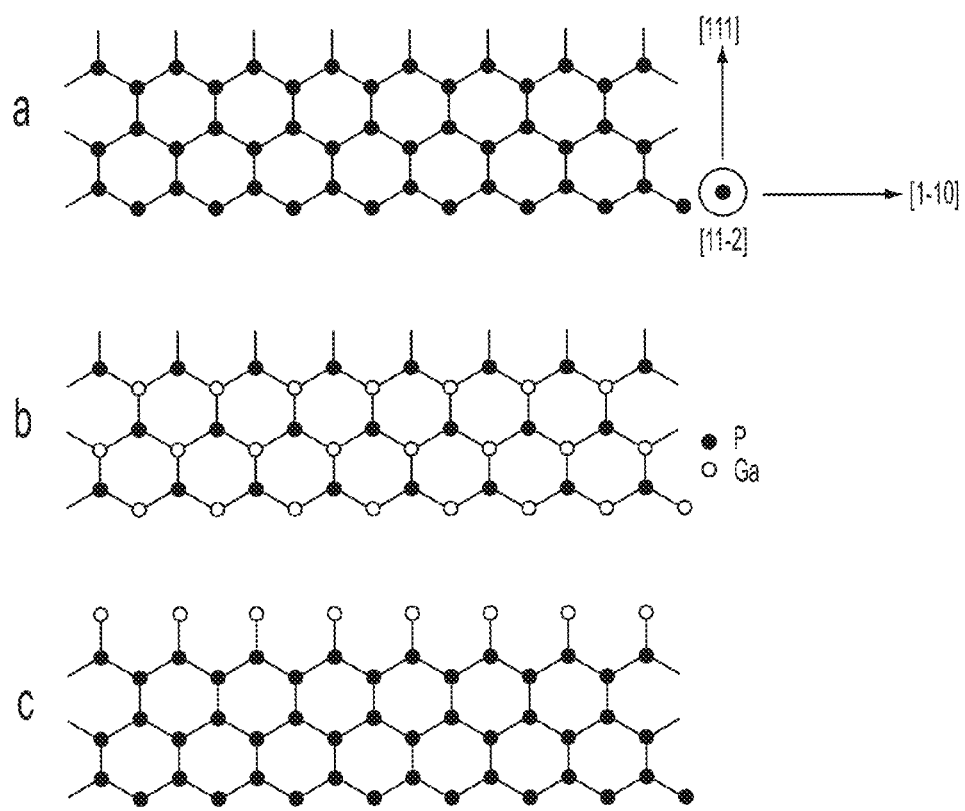
FIG. 2 schematically illustrates a) a Si (111) surface, b) a GaP (111)B surface (middle diagram), and c) how a monolayer of Ga-atoms on the top sites on the Si(111) renders the surface (111)B-like according to the invention.

Although the Si surface is non-polar (lacks A and B-sides) it would be enough with one monolayer of either group III or group V atoms to turn it into a (111)B or (111)A-like surface, respectively. FIGS. 2a and 2b schematically illustrate the atomic arrangement of a Si(111) surface and a GaP(111)N surface, respectively. FIG. 2c schematically illustrates the atomic arrangement of a Si(111) surface with Ga atoms bound to the Si dangling bonds. Observe that a group III monolayer on Si provides what is normally termed a B-like (group V) termination for the III-V semiconductors, which may be somewhat counterintuitive.

A pre-flow of a metalorganic precursor, for example a group III precursor such as TMGa for Ga or TMIn for In, before growth using metal organic vapor epitaxy (MOVPE) could render the otherwise non-polar Si surface "(111)B-like" by providing a Ga atom termination layer. Combined with the strong preference of nanowire growth along the [111]B directions, such a surface will favor vertical growth.

A further advantage is the small cross-section of the nanowires where growth is generally believed to proceed layer by layer with one single nucleation event per layer. So called anti-phase domains are thus not expected to form since they require two or more nucleation events per layer. Furthermore, when the nanowires are grown on a (111) facet of a diamond structure material as Si, the small footprint in combination with the unique directional properties of (111)B III-V nanowires will inhibit the formation of anti-phase-domain boundary defects, considered to be a major technology barrier for realization of many semiconductor devices comprising Si substrates Referring to FIG. 3 and FIG. 4, one embodiment of a method of producing a nanostructured device according to the invention comprises the steps of:

100 providing group III or group V atoms to a (111) surface of a Si substrate 3 in order to provide a group III or group V surface termination 4; and 110 growing at least one III-V semiconductor nanowire 2 from the (111) surface of the Si substrate 3.

Figure 3:
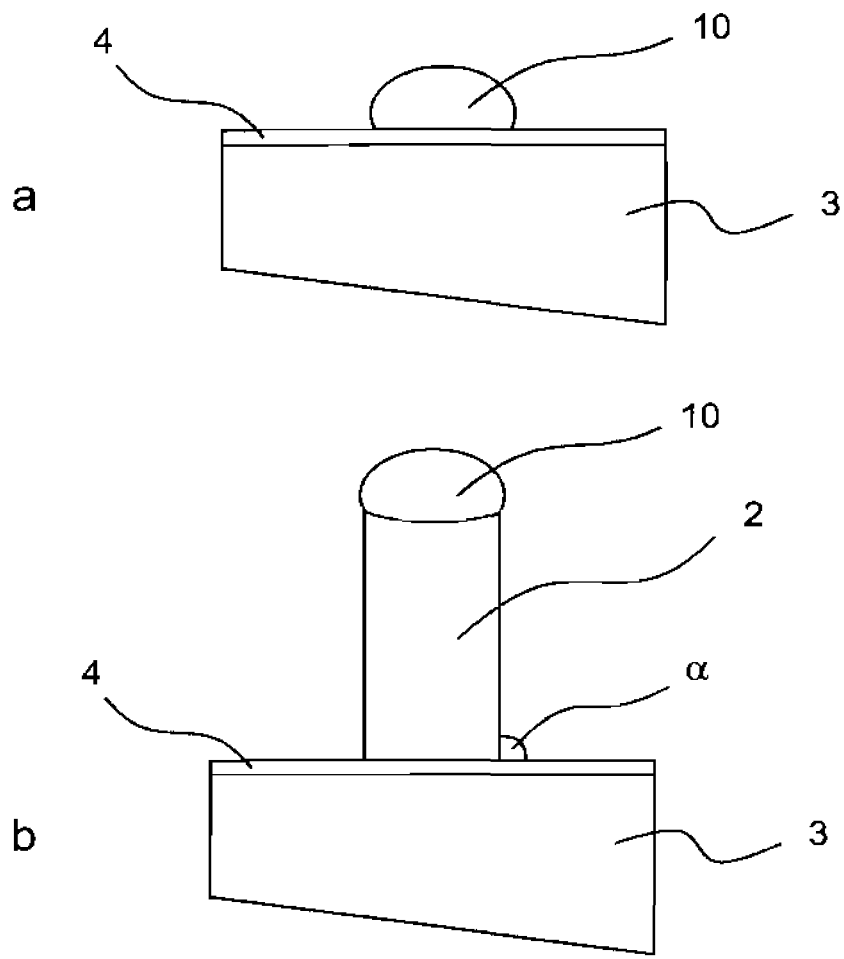
FIG. 3 schematically illustrates a) the initial stage where the catalyst particle is placed on the substrate and the surface termination is completed and b) a vertical nanowire on a Si-substrate grown on the surface terminated Si (111) surface of the substrate according to the invention.
Figure 4:
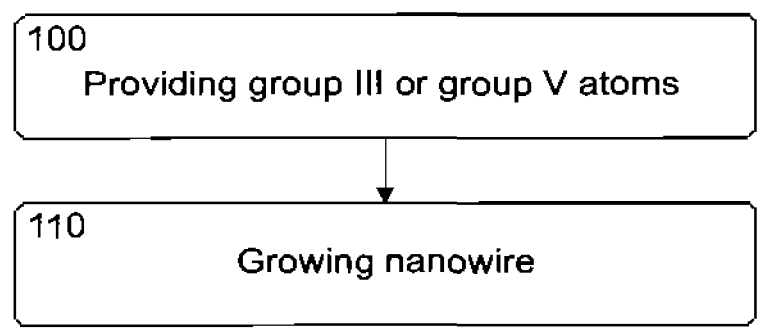
FIG. 4 is a flow chart of a method of producing a nanowire according to the present invention.

FIG. 3 schematically illustrates two stages in the production of the nanostructured device. FIG. 3a shows the situation with a growth catalyst particle 10 with the surface termination 4 prior to nanowire growth, and FIG. 3b illustrates a Si substrate 3 having a (111) surface and a vertical nanowire 2 that preferably is epitaxially grown in the (111) direction from the (111) surface. The final nanostructured device may include the growth catalyst particle 10, e.g. an Au-particle, or alternatively the growth catalyst particle 10 can be removed. Moreover growth methods not requiring a metallic growth catalyst particle 10 can be used.

One important feature of the structure formed according to the method of the invention is as mentioned that the angle α between the Si(111) surface and the nanowire is about 90° as illustrated in FIG. 3b. Thanks to the invention the certainty of growing at least one nanowire in a direction perpendicular to the Si substrate is improved. Furthermore the method provides a high yield with respect to the growth direction when growing a large number of nanowires, i.e. substantially all nanowires protrude perpendicular to the (111) surface of the Si substrate.

As appreciated by a person skilled in the art, the angle α may slightly deviate from the 90°, due to e.g. disordering, defects, strain etc. in the initial nanowire growth. In one embodiment preferably at least 95%, more preferably 100% of said substantially all nanowires 3 have an angle α to the (111) surface of the Si substrate of 90°±5°. In another embodiment at least 90%, preferably at least 95%, more preferably 100% of said substantially all nanowires (505) have an angle (550) to the (111) surface of the Si substrate of 90°±2.5°. In addition the Si substrate may be cut in such way that that the surface does not follow the (111)-plane of the Si material. Thereby nanowires protruding from the surface of the Si substrate may have a different angle to the surface.

Figure 5:
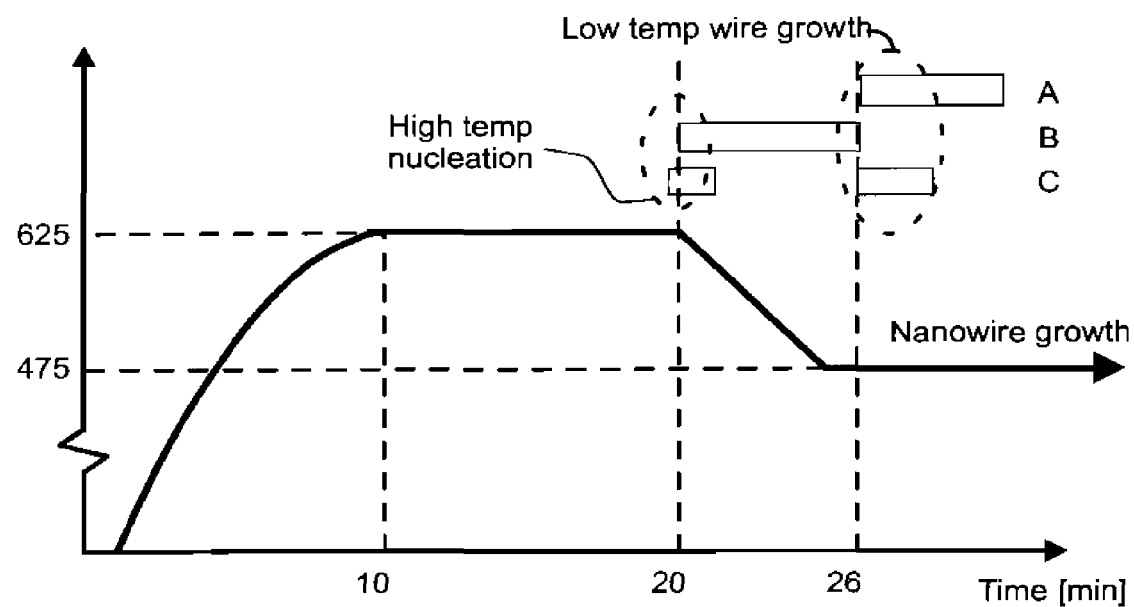
FIG. 5 schematically illustrates an example of a growth cycle resulting in nanowires protruding preferentially in an orthogonal direction from a Si (111) surface according to the invention.
Figure 6:
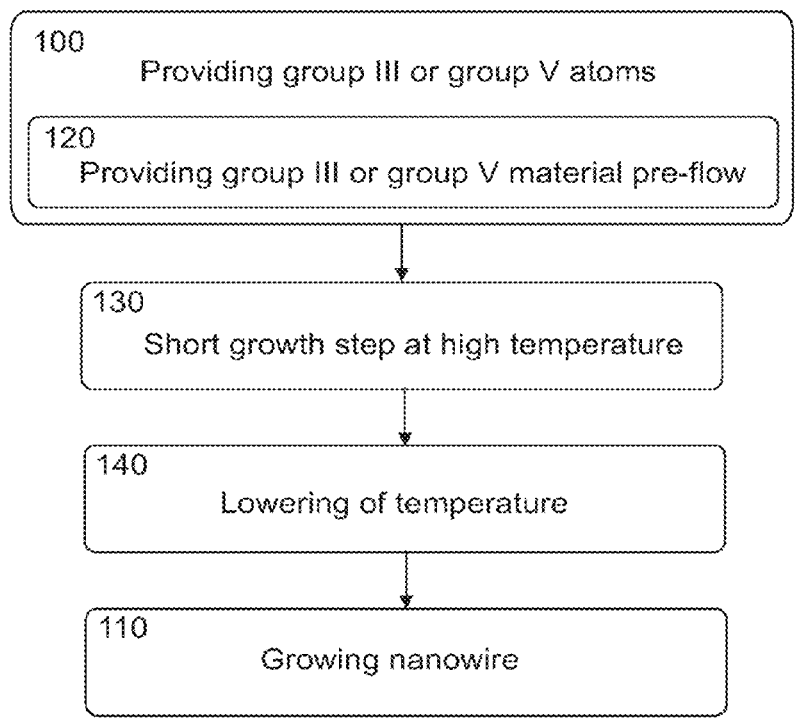
FIG. 6 is a flow chart of one embodiment of a method comprising pre-flow of group III or group V material and a high temperature growth step according to the invention.

Referring to FIG. 5 and FIG. 6, one embodiment of the method in accordance with the present invention comprises:
100 providing group III or group V atoms to a (111) surface of a Si substrate 3 in order to provide a group III or group V surface termination 4 by 120 providing a group III or group V material pre-flow at a predetermined elevated temperature to provide a group III or group V material-terminated Si(111) surface giving diffusion of the group III or group V material into a growth catalyst particle/Si interface, and formation of a group III or group V material layer in the growth catalyst particle/Si interface;
130 a short growth step at a high temperature to form a thin nucleation layer;
140 lowering of the temperature to the temperature regime normally used for nanowire growth and performing axial nanowire growth; and
110 growing at least one III-V semiconductor nanowire 2 from the (111) surface of the Si substrate 3.

Figure 7:
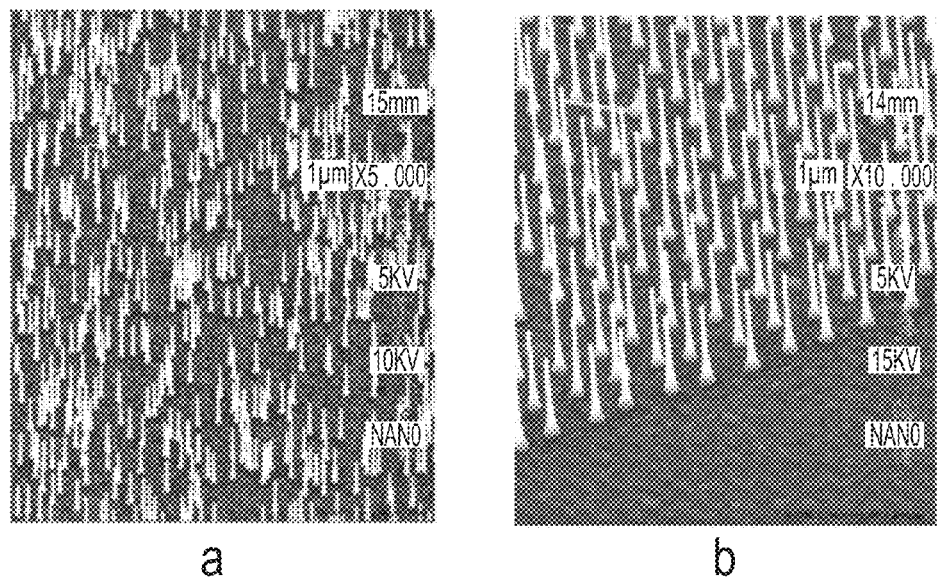
FIG. 7a is a scanning electron microscope (SEM) image of GaP/GaAs nanowires grown from a Si (111) surface according to the invention, wherein the yield was close to 100% over the entire sample.
FIG. 7b is a SEM image of nanowires where the growth was successfully combined with lithographic methods (in this case electron beam lithography) to produce arrays of site-controlled nanowires protruding normal to the surface of the Si substrate.

FIG. 5 schematically illustrates one implementation of the growth cycle outlined above that was successfully used to produce nanowires where close to 100% grew in the vertical [111] direction as shown in FIG. 7. The temperature was ramped up to 625° C. under a 100 mbar hydrogen atmosphere. After 10 min of annealing, a 5 s TMGa pre-flow was applied to render the surface Si(111):B-like and create a gold-gallium alloy. Subsequently both TMGa and PH$_3$ were introduced for 10 s to grow a thin GaP nucleation layer with (111)B orientation. Subsequently the temperature was lowered to 475° C. under a PH$_3$ flow. By using the same growth conditions as on III-V (111)B substrates, nanowire growth of e.g. GaP or GaAs could be achieved with high quality as shown in FIG. 7a. Using this nucleation method also lithographic patterning could be used with good results as shown in FIG. 7b. Control of position and direction of III-V nanowires on Si substrates are crucial parameters needed for successful fabrication of optical devices on Si, as well as most other nanowire applications where Si substrates are advantageous.

A short growth step at a higher temperature was also used by Tateno et al., Vertical GaP nanowires arranged at atomic steps on Si(111) substrates, Applied Physics Letters 89, (3), 033114 (2006), but its function was not further discussed and the group III pre-flow was not used.

The above considerations may be summarized by the following procedure for nucleation and subsequent nanowire growth.
(i) Providing a Ga pre-flow at elevated temperature to provide a Ga-terminated Si(111) surface.
    a. The exact temperature and time will vary for different column-III material, as two different mechanisms needs to be satisfied:
        i. Diffusion of Ga (III-element) into the growth catalyst particle/Si interface
        ii. Formation of a Ga layer in the growth catalyst particle/Si interface
(ii) A short growth step at a high temperature to form a thin GaP (111)B nucleation layer
(iii) Lowering of the temperature to the temperature regime normally used for nanowire growth and performing axial nanowire growth.

The procedure is also applicable for other group III and group V materials, and in the case of In it would comprise the following steps.
(i) Providing a In pre-flow at elevated temperature to provide a In-terminated Si(111) surface.
    a. The exact temperature and time will vary for different column-III material, as two different mechanisms needs to be satisfied:
        i. Diffusion of In (III-element) into the growth catalyst particle/Si interface
        ii. Formation of a In layer in the growth catalyst particle/Si interface
(ii) A short growth step at a high temperature to form a thin GaP (111)B nucleation layer
(iii) Lowering of the temperature to the temperature regime normally used for nanowire growth and performing axial nanowire growth.

Since the Ga or In is only needed at locations where the nanowires are to be grown, it may be desirable that it is only injected into the gold. This can be achieved by bringing in the metalorganic molecules at a temperature that is below the cracking temperature of the molecule, but high enough so that it can be efficiently cracked with the gold as a catalyst. Gas flows can be controlled with a very high precision in MOCVD reactors, making this process very reproducible and homogenous. The illustration in FIG. 3a shows one embodiment where the termination covers the entire substrate surface, however, the invention is not limited to this.

In an example of the surface termination process comprising Indium, the substrate is heated to 350° C., and exposed to a flow of TMIn for 2 minutes. Thereafter, the substrate is heated to 650° C. and kept at said elevated temperature for 10 minutes to achieve the In-termination of the Si(111) surface by diffusion of In within the growth catalyst particle. Subsequently, a GaAs nucleation layer is grown by introducing a flow of TMGa for 5 seconds followed by a flow of both TMGa and AsH$_3$ for 10 seconds. Then the substrate temperature is lowered to 475° C. keeping the flow of AsH$_3$. When the lower temperature of 475° C. is achieved, the growth of the vertical nanowire is initiated by introducing TMGa in addition to the AsH$_3$ for 4 to 8 minutes. The structure is then slowly cooled down to room temperature in a continuous flow of AsH$_3$.

As is apparent for the person skilled in the art, and as discussed above, Ga or In, and the formation of a Ga or In termination in the growth catalyst particle/Si interface is a non-limiting example as regards to materials.

With this method it is also possible to realize well defined growth of nanowires on any etched, or in other fashion fabricated (111) surface, for example etched ridges on (001) Si Substrates.

The method is transferable to III-V nanowire growth on other diamond structure substrates as Ge and C etc.

The method according to the invention can be combined with various patterning techniques, and offers a unique approach for providing precisely positioned vertical III-V nanowires on a Si(111) surface.

A nanostructured device according to the present invention comprises a plurality of semiconductor nanowires 2, preferably made of a III-V material, grown on a (111) surface of a Si substrate 3, wherein substantially all nanowires 3 protrude perpendicular to the (111) surface. Preferably said substantially all nanowires 2 are grown in a (111)B direction.

As indicated above the ability to precisely position individual nanowires or a plurality of nanowires is essential in many applications in order e.g. to be able to manufacture semiconductor devices for electronic, optoelectronic, photonic, light emitting diode applications, etc. In addition, preferably all nanowires should be directed in the same direction from the substrate surface. In one embodiment of the nanostructured device according to the present invention the nanowires are grown on the (111) surface in an ordered pattern in compliance with a predetermined device layout.

Each nanowire 2 may positioned at a predetermined position on the (111) surface of the Si substrate 3 with a positional deviation from the predetermined position is no more than half the diameter of the nanowire, preferably no more than 20% of the diameter of the nanowire, more preferably no more than 5% of the diameter of the nanowire, still more preferably no more than 1% of the diameter.

FIG. 7 shows that substantially all nanowires can be grown in a direction perpendicular to the (111) surface. In a nanostructured device according to one embodiment of the present invention at least 90%, preferably at least 95%, more preferably 99%, still more preferably 100% of the nanowires protrude perpendicular to the (111) surface. As mentioned above the angle α of the nanowires to the surface of the substrate may deviate slightly from 90°.

In one embodiment of a nanostructured device according to the present invention the nanowires are grown on the (111) surface in a periodic pattern.

Figure 8A:
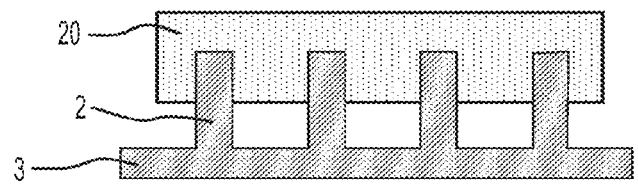
FIG. 8a schematically illustrates a coalescence layer grown from the nanowires according to the invention.

In another embodiment of a method according to the present invention the nanostructured device comprises a coalescence layer 20 grown from the nanowires 2. Referring to FIG. 8*a*, a plurality of vertically aligned nanowires 2 protruding from a substrate can be used as templates for re-growth of continuous III-V semiconductor layers. Continuous III-V semiconductor layers grown on Si usually exhibit a high amount of anti phase domains. In the present invention the preferential (111)B directional growth of individual nanowires and the initial nucleation of only one sub material on only one of the two Si fcc sub lattices for all nanowires will ensure that all these nanowires share the same crystal direction (or phase), so that a semiconductor layer coalesced from several nanowires do not exhibit anti-phase domains, i.e. the coalescence layer 20 is substantially single domain. Preferably the coalescence layer is grown on nanowires grown in a periodic pattern.

One embodiment of a nanostructured device according to the invention is a nanowire LED, wherein nanowires are part of a LED structure comprising a pn or pin junction in order to produce light.

In one implementation of the present invention vertical light emitting diodes (LEDs) based on GaAs nanowires, epitaxially grown Si substrates, have been fabricated. For comparison corresponding LEDs have been fabricated on GaP substrates. LED functionality has been established on both kinds of substrates. The structures have been evaluated in terms of temperature-dependent photoluminescence (PL), electroluminescence (EL), and radiation pattern. Such nanoscale light-sources integrated on the Si platform may play a major role for future nanophotonics and on-chip optical communication.

Each LED structure is built around a GaAs NW core, directly grown on either GaP or Si. Each single GaAs NW acts as the active region in these individual nanosized p-i-n light emitting structures.

Figure 8B:
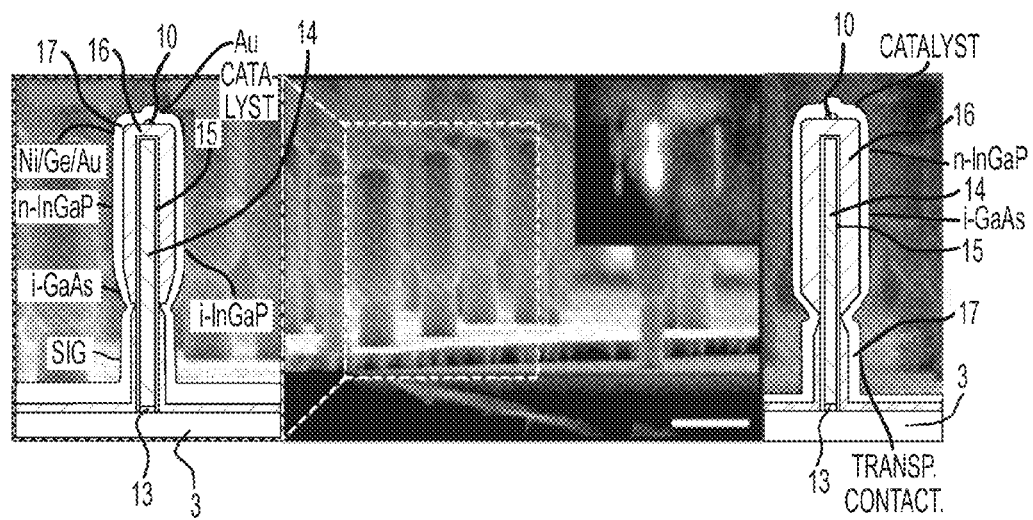
FIG. 8b is a SEM image showing nanowire LEDs on GaP and based on vertical nanowires on a Si substrate according to the invention, wherein the edge of the contact layer is visible so the both contacted and uncontacted LEDs can be seen, the device structure is schematically illustrated and in the right upper insert is an optical micrograph EL from a single electrically probed nanowire LED seen from the side.

The LED structures, shown in FIG. 8*b*, are p-i-n diode structures. The substrate 3 is an integral part of each device, as it functions as a common p-layer. This alters a specific sequence of semiconductor materials in the LED structure depending on what substrate 3 that the nanowires 2 are grown on:

On GaP the structure the sequence is: p-GaP(substrate 3)/i-GaP(first nanowire segment 13)/i-GaAs(second nanowire segment 14)/i-InGaP(cladding layer 15)/n-InGaP(cap 16).

On Si the structure is: p-Si(substrate 3)/i-GaP(first nanowire segment 13)/i-GaAs(second nanowire segment 14)/i-InGaP(cladding layer 15)/n-InGaP(cap 16).

The i-GaP(nanowire) layer in the nanowire base is approximately 60 nm thick in both the devices and serves the dual purposes of a nucleation segment for improved growth quality and electron barrier. The metal organic sources used were TMGa and TMIn together with $AsH_3$, $PH_3$, and $Si_2H_6$ as precursor gases. Two growth steps were employed. First, 2 pm long GaAs/GaP nanowires were grown on p-type GaP (111)B (p=~$10^{18}$ cm$^{-3}$) and Si (111) (p≈$10^{15}$ cm$^{-3}$) substrates by particle assisted growth using randomly deposited, 60 nm diameter nm sized Au aerosols with a particle density of 1/μm². The nanowires were capped with 40 nm thick radial InGaP cladding layer, nominally lattice matched to GaAs. After this step, samples were unloaded for photoluminescence characterization or subsequent fabrication of the nanowire LEDs. 80 nm thick $SiO_2$ was deposited onto the samples. The $SiO_2$ was back etched back to only cover the substrate surface and up to approximately 1 μm of the nanowire side. The samples were then reloaded into the MOVPE reactor and a radial Si-doped InGaP layer was selectively grown on the upper part of the GaAs/InGaP core structure. The LED structures were fully covered with 150-300 nm thick 200×200 μm² quadratic Ni/Ge/Au contacts 17, each covering approximately 40000 individual nanowire LED structures. Schematical cross sectional views and scanning electron microscopy (SEM) image of the structure is shown in FIG. 8. The non transparent contact 17 on these devices will absorb the majority of the outgoing light, since 10 nm Au absorbs approximately 40% at a wavelength of 850 nm. The p-contact was fabricated on the backside of the substrate with conductive Ag paste. Other means of contacting are known in the art and easily adopted to the present method and device.

One important difference between the Si and the GaP device is the heterostructure sequence in the base of the nanowires, on GaP substrate being p-GaP(bulk)/i-GaP(nanowire)/i-GaAs while on Si substrate being p-Si(bulk)/i-GaP(nanowire)/i-GaAs(nanowire), where both hole injection conditions, internal resistance and should be expected to be appreciably different between the two structures.

Figure 9:
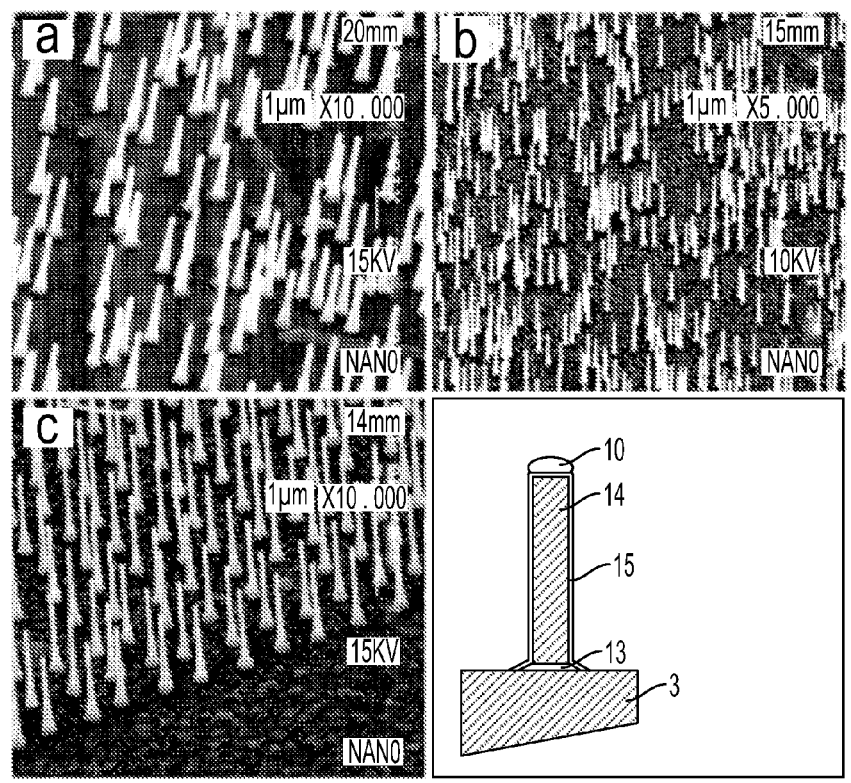
FIG. 9 is SEM images of a) nanowires grown on GaP, b) nanowires grown on Si, c) ordered array of GaAs nanowires grown on Si, and d) schematic illustration of the structure of the first growth run, being the same nanowire structure used for photoluminescence (PL) measurements.

FIGS. 9*a-c* depicts nanowire LED structures after the first MOVPE step. They are GaAs nanowires with a thin InGaP cladding layer and a GaP nucleation segment in the base of the nanowires, and with the Au based seed particle still attached to the top. Such structures were also transferred to neutral substrates for PL characterization. As shown in FIG. 9 the yield with respect to growth direction of the method in accordance with the present invention is essentially 100 percent on both GaP and Si substrates, i.e. the fabrication method of these kind of nanowire structures on Si is improved to the degree that the substantially all nanowires are uniformly aligned the (111) direction normal to the substrates and essentially no nanowires are grown in the three declined (111) directions that also extends out from the substrate. Also, by utilizing the method of the invention this is the first realization of growth arrays of III-V vertical nanowires in a predefined ordered pattern on Si substrates, as seen in FIG. 9*c*. Control of position and direction of these substrate-grown nanowires are crucial parameters needed for successful fabrication of optical devices, as well as most other applications. FIG. 9*d* schematically illustrates the LED structure comprising a Si(111)/GaP(111)B substrate 3, a GaP nucleation layer being a first nanowire segment 13, a GaAs nanowire core being a second nanowire segment 14, a InGaP cladding layer 15 and a Au seed particle 10.

In one embodiment of a nanostructured device according to the invention that is a nanowire LED one of a p or a n region of the pn or pin junction is at least partly in the substrate 3.

In one embodiment of a nanostructured device according to the invention that is a nanowire LED each nanowire 2 at least partly is enclosed in a cap layer 16 and the n or p region of the pn or pin junction at least partly is in the cap layer 16.

In one embodiment of a nanostructured device according to the invention that is a nanowire LED, the nanostructured device comprises common p and n regions formed between nanowires 2.

Photoluminescence (FL) measurements were carried out at room temperature and at a temperature of 10 K. A laser emitting at 473 nm was used as an excitation source. The PL was collected by an optical microscope, dispersed through a spectrometer and detected by a CCD camera cooled by liquid nitrogen.

To study the PL from the nanowires without influence of the substrate, the nanowires were broken off and transferred from the substrate where they were grown, and then deposited on a patterned Au surface. In this way the nanowires could also be studied individually. The PL spectra acquired at 10 K from the as-grown nanowires were similar for nanowires grown from a Si substrate and the nanowires grown from a Si substrate and the nanowires grown from a GaP substrate. The spectra from individual nanowires showed larger differences, with the nanowires grown from a GaP substrate being more structured. The average PL intensity for the nanowires grown from Si was about a factor of 20 lower than for the corresponding nanowires grown from GaP. This is in fair agreement with the 10-30 times lower EL seen for the Si-LED as compared to the GaP-LED. At room temperature the spectra are broad and featureless and there is very little spectral difference between nanowires from the two samples.

Figure 10C:
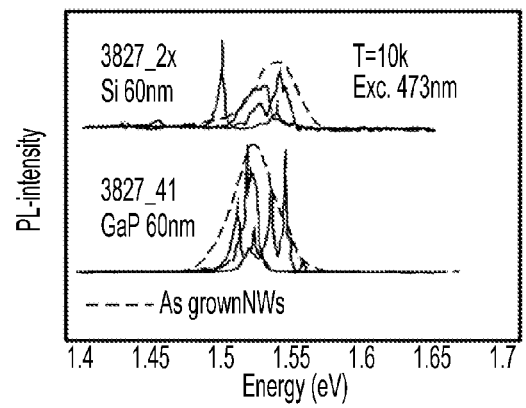
FIGS. 10a-c are PL graphs of nanowires grown on a Si substrate according to the present invention.

Relatively low luminous efficiency in GaAs nanowires have been reported previously and been attributed to stacking faults. Reducing crystal lattice strain between the GaAs core and the radially grown InGaP layers is of great importance for the PL intensity, FIG. 10. The individual diffusion lengths of the In and Ga material and the parasitic growth on GaP and Si surface is very different, requesting an individual fabrication optimization between substrates that could not be fully performed in this study.

Both the LED on GaP and on Si demonstrated electroluminescence when applying a forward bias. The spectral peak of the light is in fair agreement with the GaAs bandgap energy.

Figures 10A, 10B:
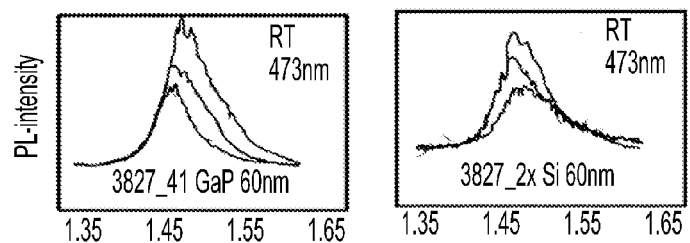

As seen In FIG. 10a and b the light power/current dependence is shown for the Si based and GaP based LEDs. The LED on GaP lights up at half the current load (20 mA) of the Si (40 mA) and at 60 mA the power output is approximately 30 times higher on the GaP substrate. However, at 100 mA the power ratio has decreased to 10 times the power ratio of the Si based LED. The EL spectral peak is shown for 80 mA load for both devices. The Si LED peak show a slight red shift and tail with a possible extra peak around 1.35 eV as compared to the GaP substrate device. The shift in peaks can be explained by the different In and Ga diffusion on GaP and Si leading to different InGaP composition. By pushing the devices, going to higher currents a peak power can be seen for approximately 140 mA for the GaP device. This is never seen on the Si device and may be an indication that non-radiative recombination or competing leakage mechanisms still dominate the EL at these current levels.

Figure 11:
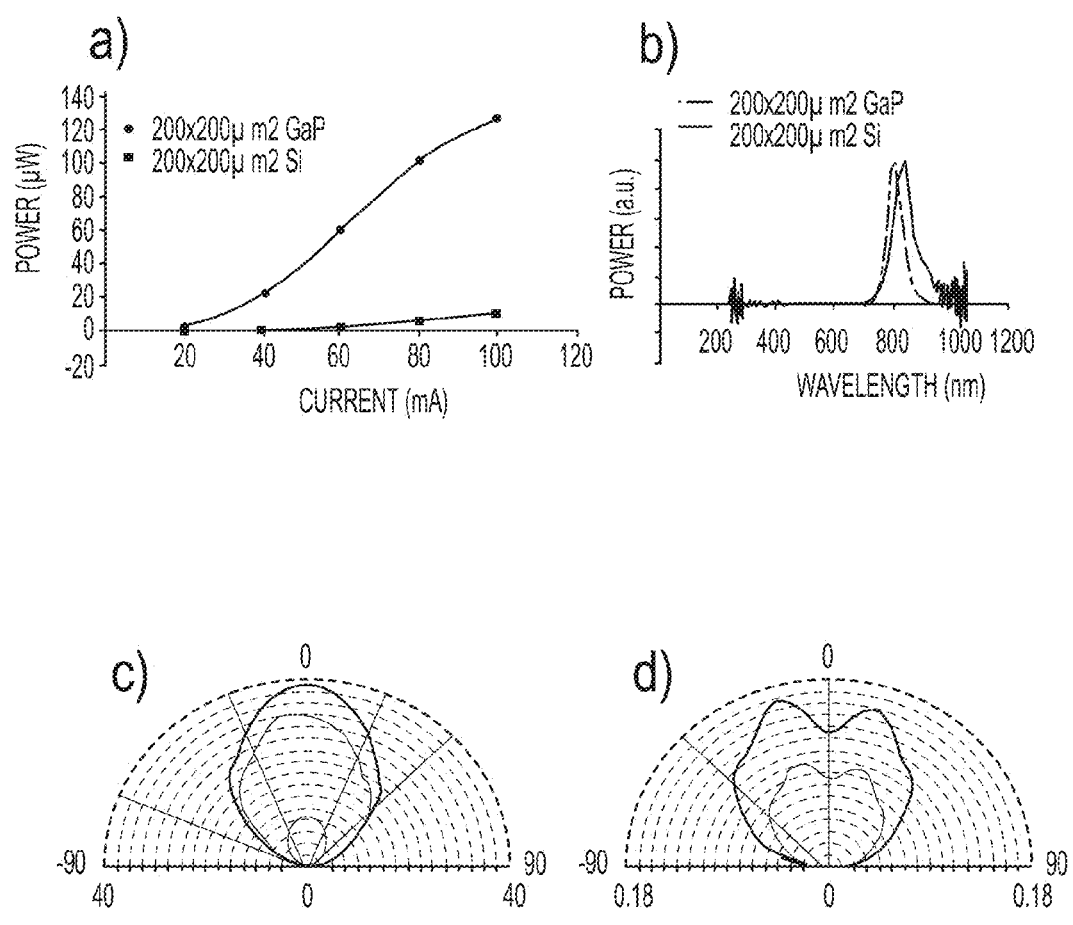
FIG. 11 shows a) power dependence of electroluminescence (EL) of GaAs LEDs grown on GaP and Si, b) EL spectra from GaP and Si based LED nanostructures, c) the radiation pattern with the seed particle, and d) the radiation pattern with the seed particle removed.

FIG. 11a shows a diagram of power dependence of electroluminescence of GaAs LEDs grown on GaP and Si and FIG. 11b shows EL spectra at 80 mA from GaP and Si based diodes.

There is a clear difference between the radiation pattern of a device where the seed particle still being attached and one without the Au particle on the top, as shown in the diagrams of FIG. 11c and d, respectively. This is of significance, as these structures have metal contacts of twice the thickness than the seed particle size. This clearly shows that removal of the seed particle may be preferable, especially in a device where vertical extraction of the light is of importance.

While the invention has been described in connection with what is presently considered to be the most practical and preferred embodiments, it is to be understood that the invention is not to be limited to the disclosed embodiments, on the contrary, it is intended to cover various modifications and equivalent arrangements within the appended claims.

The invention claimed is:

1. A nanostructure device, comprising:
a plurality of III-V semiconductor nanowires grown on a Si(111) surface of a Si substrate, wherein substantially all of the III-V semiconductor nanowires protrude perpendicular to the Si(111) surface, and wherein each of the plurality of III-V semiconductor nanowires comprises a catalyst on an end of the III-V semiconductor nanowires distal from the Si(111) surface of the Si substrate.

2. The nanostructured device according to claim 1, wherein said substantially all III-V semiconductor nanowires are grown in a (111)B direction.

3. The nanostructured device according to claim 1, wherein the nanowires are grown on the Si(111) surface in an ordered pattern in compliance with a predetermined device layout.

4. The nanostructured device according to claim 1, wherein said substantially all III-V semiconductor nanowires comprise a longitudinal axis and have an angle α between the longitudinal axis and the (111) surface of the Si substrate of 90°±5°.

5. The nanostructured device according to claim 4, wherein said substantially all III-V semiconductor nanowires have an angle a between the longitudinal axis and the (111) surface of the Si substrate of 90°±2.5°.

6. The nanostructured device according to claim 1, further comprising a coalescence layer grown from the III-V semiconductor nanowires, wherein the coalescence layer is substantially single domain.

7. The nanostructured device according to claim 1, wherein each III-V semiconductor nanowire comprises a nucleation segment at a nanowire base.

8. The nanostructured device according to claim 7, wherein the nucleation segment is about 60 nm thick.

9. The nanostructured device according to claim 1, further comprising at least one of a termination layer and a nucleation layer located on the Si(111) surface, wherein the termination layer comprises a Group III or Group V layer, and the nucleation layer comprises a Group III-V layer having a (111)B orientation.

10. An electronic or optoelectronic device comprising:
a nanostructured device, the nanostructured device comprising:
a plurality of III-V semiconductor nanowires grown on a Si(111) surface of a Si substrate, wherein substantially all of the III-V semiconductor nanowires protrude perpendicular to the Si(111) surface, and wherein each of the plurality of III-V semiconductor nanowires comprises a catalyst on an end of the III-V semiconductor nanowires distal from the Si(111) surface of the Si substrate.

11. A photonic device comprising:

a nanostructured device, the nanostructured device comprising:

a plurality of III-V semiconductor nanowires grown on a Si(111) surface of a Si substrate, wherein substantially all of the III-V semiconductor nanowires protrude perpendicular to the Si(111) surface, and wherein each of the plurality of III-V semiconductor nanowires comprises a catalyst on an end of the III-V semiconductor nanowires distal from the Si(111) surface of the Si substrate.

12. A light emitting diode (LED) device comprising;

nanostructured device, the nanostructured device comprising:

a plurality of III-V semiconductor nanowires grown on a Si(111) surface of a Si substrate, wherein substantially all of the III-V semiconductor nanowires protrude perpendicular to the Si(111) surface, wherein each of the plurality of III-V semiconductor nanowires comprises a catalyst on an end of the III-V semiconductor nanowires distal from the Si(111) surface of the Si substrate, wherein each nanowire is a part of a LED structure, and wherein the LED structure comprising a pn unction or a p-i-n junction in order to produce light.

13. A nanostructured device, comprising:

a Si substrate having a Si(111) surface;

at least one of a termination layer and a nucleation layer located on the Si(111) surface, wherein the termination layer comprises a Group III or Group V layer, and the nucleation layer comprises a Group III-V layer having a (111)B orientation; and a plurality of III-V semiconductor nanowires grown over the Si(111) surface, wherein substantially all of the III-V semiconductor nanowires protrude perpendicular to the Si(111) surface, and wherein each of the plurality of III-V semiconductor nanowires comprises a catalyst on an end of the III-V semiconductor nanowires distal from the Si(111) surface of the Si substrate.

14. The nanostructured device according to claim 13, wherein said substantially all III-V semiconductor nanowires are grown in a (111)B direction.

15. The nanostructured device according to claim 13, wherein the at least one of the termination layer and the nucleation layer comprises the termination layer.

16. The nanostructured device according to claim 15, wherein the termination layer comprises a Group III or Group V monolayer which covers the entire Si(111) surface.

17. The nanostructured device according to claim 16, wherein the termination layer comprises the Group III monolayer selected from a Ga monolayer and an In monolayer.

18. The nanostructured device according to claim 16, wherein the termination layer comprises the Group V monolayer.

19. The nanostructured device according to claim 13, wherein the at least one of the termination layer and the nucleation layer comprises the Group III-V nucleation layer having the (111)B orientation.

20. The nanostructured device according to claim 13, wherein the at least one of the termination layer and the nucleation layer comprises both the termination layer and the nucleation layer.

* * * * *